US007953578B2

(12) United States Patent
Roger et al.

(10) Patent No.: US 7,953,578 B2
(45) Date of Patent: May 31, 2011

(54) SYSTEMS AND METHODS OF LIMITING CONTACT PENETRATION IN NUMERICAL SIMULATION OF NON-LINEAR STRUCTURE RESPONSE

(75) Inventors: Grimes Roger, Fall City, WA (US); XinHai Zhu, Pleasanton, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 484 days.

(21) Appl. No.: 12/127,095

(22) Filed: May 27, 2008

(65) Prior Publication Data
US 2009/0299702 A1 Dec. 3, 2009

(51) Int. Cl.
G06F 17/50 (2006.01)
G06F 7/60 (2006.01)
G06G 7/48 (2006.01)

(52) U.S. Cl. ............ 703/1; 703/2; 703/6; 703/7; 703/8; 703/10; 703/11

(58) Field of Classification Search .................. 703/1, 2, 703/6, 7, 8, 10, 11
See application file for complete search history.

(56) References Cited

U.S. PATENT DOCUMENTS

| 6,560,570 B1 * | 5/2003 | Dohrmann et al. ............... 703/7 |
| 6,678,642 B1 * | 1/2004 | Budge ............................... 703/2 |
| 6,810,370 B1 * | 10/2004 | Watts, III ........................ 703/10 |
| 7,308,387 B1 * | 12/2007 | Feng et al. ........................ 703/1 |
| 7,363,198 B2 * | 4/2008 | Balaniuk et al. .................. 703/2 |
| 2002/0077795 A1 * | 6/2002 | Woods et al. ..................... 703/6 |
| 2002/0177983 A1 * | 11/2002 | Maker .............................. 703/2 |
| 2002/0183993 A1 * | 12/2002 | Hirata .............................. 703/2 |
| 2006/0004550 A1 * | 1/2006 | Coles et al. ...................... 703/1 |

OTHER PUBLICATIONS

Xu et al. "Parallel Contact Algorithms for Nonlinear Implicit Transient Analysis", Computational Mechanics 34 (2004) 247-255.*
Hirota et al. "An Implicit Finite Element Model for Elastic Solids in Contact", Sep. 2001.*
Kugener, Stephane. "Simulation of the Crimping Process by Implicit and Explicit Finite Element Methods", AMP Journal of Technology vol. 4 Jun. 1995.*
Un, Kerem. "A Penetration Based Finite Element Method for Hyperelastic Three-Dimensional Biphasic Tissues in Contact", Apr. 2002.*
Wriggers, P. "Finite Element Algorithms for Contact Problems", Nov. 2000.*

* cited by examiner

*Primary Examiner* — Kamini S Shah
*Assistant Examiner* — Shambhavi Patel
(74) *Attorney, Agent, or Firm* — Roger H. Chu

(57) ABSTRACT

Systems and methods of limiting contact penetration in numerical simulation of non-linear structure response using implicit finite element analysis are described. According to one aspect, a finite element analysis (FEA) model of a structure is defined as a number of nodes and elements based on geometry and material properties of the structure. A time-marching analysis of the FEA model is then performed. The time-marching analysis results contain a number of solutions of non-linear structure response at respective time steps. Solution at each time step requires at least one iteration to compute. Non-linear structure response is determined in the following manner: 1) determining a search direction; 2) calculating a contact penetration parameter in the search direction; and 3) finding a minimum energy imbalance location along the search direction as a solution which is further restricted by the CPP such that contact penetration of the structure is substantially limited.

20 Claims, 9 Drawing Sheets

Solid Element

Shell or Plate Element

Beam or Truss Element

SYSTEMS AND METHODS OF LIMITING CONTACT PENETRATION IN NUMERICAL SIMULATION OF NON-LINEAR STRUCTURE RESPONSE

FIELD OF THE INVENTION

The present invention generally relates to mechanical computer-aided engineering analysis, more particularly to systems and methods of limiting contact penetration in numerical simulation of non-linear structure response using implicit finite element analysis.

BACKGROUND OF THE INVENTION

Today, computer aided engineering (CAE) has been used for supporting engineers in many tasks. For example, in a structure or product design procedure, CAE analysis, in particular finite element analysis (FEA), has often been employed to evaluate responses (e.g., stresses, displacements, etc.) under various loading conditions (e.g., static or dynamic).

FEA is a computerized method widely used in industry to simulate (i.e., model and solve) engineering problems relating to complex products or systems (e.g., cars, airplanes, etc.) such as three-dimensional non-linear structural design and analysis. FEA derives its name from the manner in which the geometry of the object under consideration is specified. The geometry is defined by elements and nodes. There are many types of elements, solid elements for volumes, shell or plate elements for surfaces and beam or truss elements for one-dimensional structure objects. Example elements are shown in FIG. 1.

With the advent of the modern digital computer, FEA has been implemented as FEA software. FEA software can be classified into two general types: implicit and explicit. Implicit FEA software uses an implicit equation solver to solve a system of coupled linear equations, while explicit FEA software does not solve coupled equations but explicitly solves for each unknown assuming them uncoupled. Additionally, to evaluate dynamic responses, either implicit or explicit FEA is conducted at a number of solution cycles or time steps in time-marching analysis. At each solution cycle a particular structural response is obtained. Time increment between two consequent solution cycles is referred to as time step $\Delta t$.

Impact events (e.g., car crash, metal forming, etc.) are preferably simulated using the explicit FEA. However, the explicit FEA method is numerically unstable, which can be overcome or compensated by using very small time step (in the order microsecond $10^{-6}$ second). As a result, huge number of time steps are required to simulate just a very short period of time (e.g., 0.1 second). Even with a state-of-the-art computer system, it takes a lot of real time (in the order of many hours) to perform this kind of analysis. Hence, it is more feasible to simulate static or quasi-static engineering problems using the implicit FEA, which allows a much larger time step size. Generally, the solution for each time step achieves convergence (based on a predefined tolerance) with one or more iterations.

One of the physical structural behaviors in simulating impact events is structural contact, which is defined as two portions of a FEA model touching each other in FEA analysis. One of the prior art solutions to simulate the structural contact is referred to as penalty method, in which a compensating force or spring is introduced after a structural contact penetration has been detected in a particular time step of a time-marching analysis. The size of the compensating force or spring is dependent upon the magnitude of contact penetrations.

The penalty method works quite well in explicit FEA. However, applying such method in the implicit FEA analysis, the simulation results are not as good and often not acceptable. In particular, the FEA mesh model would become distorted due to a large fictitious compensating forces or springs resulting from large contact penetrations between two time steps in the implicit FEA.

FIGS. 2A and 2B are diagrams showing implicit FEA results of a metal forming simulation at two consecutive time steps using a prior art approach. Shown in FIG. 2A, a first part or object (e.g., a blank sheet metal) 202 is pushed towards a second part or object 204 (e.g., a die configured to receive the blank) initially (i.e., step 0). At the next time step (i.e., step 1) shown in FIG. 2B, large contact penetration 220 results between the first and the second objects. It is evident that the simulation results are physically impossible. With such large contact penetrations, a correction measure based on the penalty method (e.g., applying counter forces or springs at the contact penetration locations) could not reverse damages in the FEA mesh model. Therefore, it would be desirable to have improved systems and methods of limiting contact penetration in numerical simulation of non-linear structure responses using implicit finite element analysis.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention discloses systems and methods of limiting contact penetration in numerical simulation of non-linear structure response using implicit finite element analysis. According to one aspect, a finite element analysis (FEA) model of a structure is defined as a number of nodes and elements based on geometry and material properties of the structure. A time-marching analysis of the FEA model is then performed. Results of the time-marching analysis contain a number of solutions of non-linear structure response at respective time steps. Solution at each time step requires at least one iteration to compute. Non-linear structure response is determined in the following manner: 1) determining a search direction; 2) calculating a contact penetration parameter (CPP) in the search direction; and 3) finding a minimum energy imbalance location along the search direction as a solution which is further restricted by the CPP such that contact penetration of the structure is substantially limited.

According to another aspect, a set of approximate nodal contact distances is calculated from the immediate prior iteration. The set of approximate nodal contact distances is calculated from the update geometry and non-linear structure response (e.g., nodal displacement) between each of the nodes and each of the surfaces formed by the elements (i.e., plates or solids) of the FEA models. Three different assumptions are used for the calculations: 1) node and surface both moving; 2) node moving and surface stationary; and 3) node stationary and surface moving. The nodal contact distances are calculated using each assumption individually. The contact penetration parameter (CPP) is calculated as the ratio between the minimum (i.e., most conservative estimate) of the approximate nodal contact distances and the no-contact nodal displacements. The no-contact nodal displacement is predetermined at the onset of each iteration assuming no contact would occur. The CPP is a real number between 0 and 1. The CPP is applied to the solution of the implicit FEA solver so that contact penetration is substantially limited while in search of the minimum energy imbalance location.

According to one embodiment, the present invention is a method of limiting contact penetration in numerical simulation of non-linear response of a structure, the method comprises at least the following: defining a finite element analysis (FEA) model of the structure based on initial geometry of the structure, wherein the FEA model includes a plurality of nodes and a plurality of elements; performing a time-marching implicit FEA of the FEA model, the time-marching implicit FEA results comprise a plurality of solutions of the non-linear response of the structure at respective time steps, wherein each of the solutions requires at least one iteration to compute and wherein the non-linear response of the structure includes an updated geometry of the structure; determining a search direction at each of the at least one iteration; calculating a contact penetration parameter in the search direction using the non-linear response of the structure obtained in immediate prior iteration; and determining a minimum energy imbalance location, in the search direction, scaled by the CPP to substantially minimize contact penetration of the structure, wherein the location is the particular one of the plurality of the solutions of the non-linear responses of the structure.

The method further includes calculating a plurality of approximate nodal contact distances between each of the plurality of nodes and each of a plurality of surfaces formed by the plurality of elements. There are three assumption as to the calculations: 1) each of the plurality of nodes and each of the surfaces are assumed both moving along the search direction according to the non-linear response and updated geometry of the structure; 2) each of the plurality of nodes is assumed moving along the search direction according to the non-linear response and updated geometry of the structure while each of the surfaces is assumed to be stationary; or 3) each of the plurality of nodes is assumed to be stationary while each of the surfaces is assumed moving along the search direction according to the non-linear response and updated geometry of the structure. The most conservative estimate based on these assumptions is used (e.g., minimum of the three calculations).

Further objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

Implicit FEA refers to the use of an implicit solver to solve coupled linear equations for the unknowns. Frequently, this takes the form $K u = F$, where K is the global stiffness matrix, u is the unknown displacement array and F is the global force array. The stiffness matrix K is formed from each of the elements in a FEA model and is based on geometry and material properties of each of the elements. When a non-linear structure response is desired, the stiffness matrix may vary at each time step in a time-marching analysis. The unknown displacement array u is solved and may be used for forming the stiffness matrix for the next time step or solution cycle.

Embodiments of the present invention are discussed herein with reference to FIGS. 3-6. However, those skilled in the art will readily appreciate that the detailed description given herein with respect to these figures is for explanatory purposes as the invention extends beyond these limited embodiments.

Figure 3:
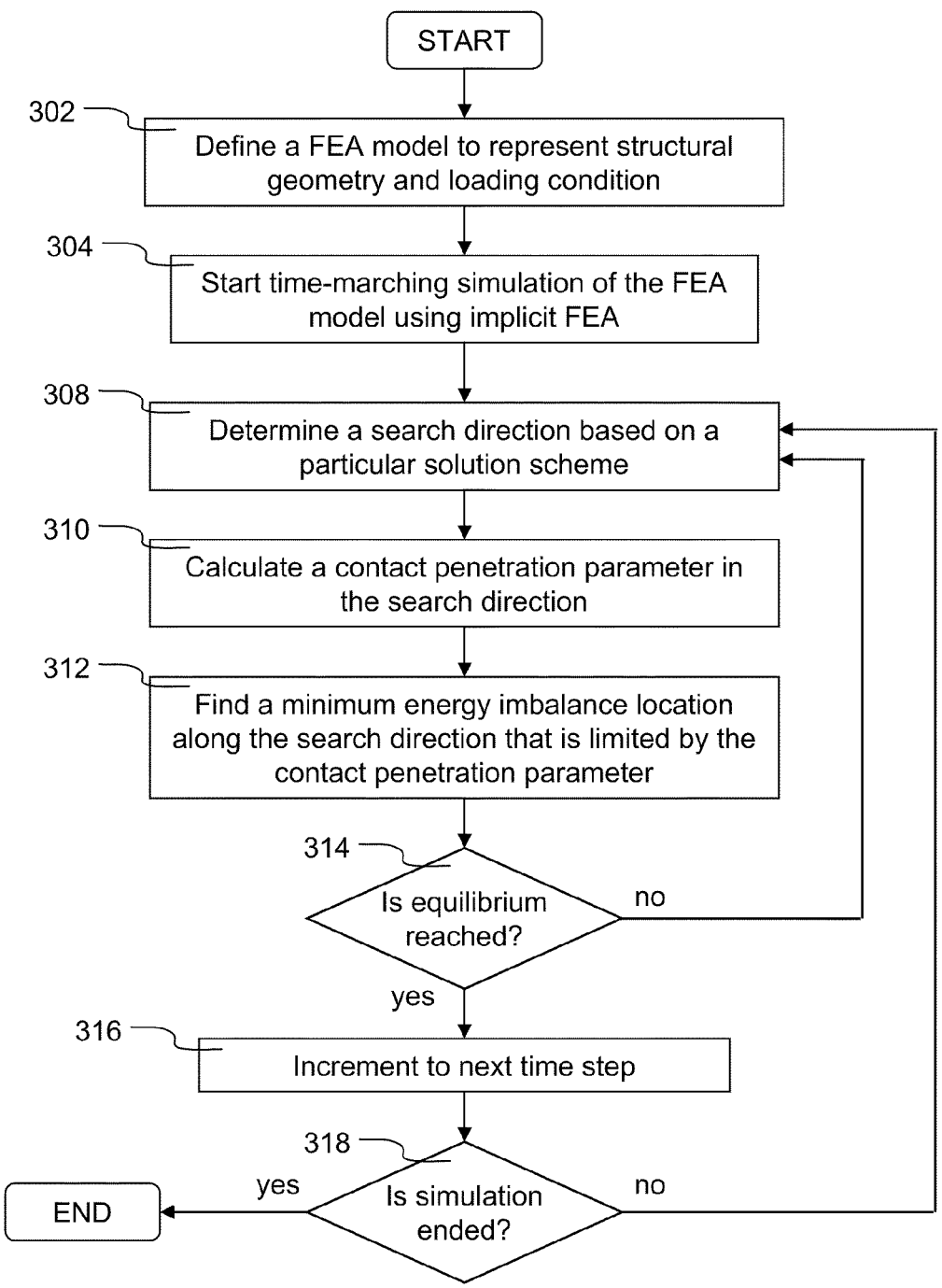
FIG. 3 is a flowchart illustrating an exemplary computer-implemented process of limiting contact penetrations in simulating non-linear structural behaviors using implicit finite element analysis, according to an embodiment of the present invention

Referring first to FIG. 3, there is shown a flowchart illustrating an exemplary process 300 of limiting contact penetration in numerical simulation of non-linear structure response using implicit finite element analysis in accordance with one embodiment of the present invention. The process 300 may be implemented in software, hardware or a combination of both.

The process 300 starts by defining a finite element analysis (FEA) model of a structure (e.g., a car, a metal forming of a metal part, etc.) from initial geometry and material properties of the structure at 302. The FEA model includes a number of nodes and elements. Additionally, the FEA model may also include loading condition or initial condition to be use in the numerical simulation. Next, at 304, a time-marching analysis of the FEA model (i.e., numerical simulation) is performed using implicit FEA. The results of the time-marching analysis include a number of solutions of non-linear structure response at respective time steps. The solution at each of the time steps requires at least one iteration to compute. In the beginning of each iteration, the process 300 determines a search direction based on a particular solution scheme (e.g., Newton-Raphson, Broyden-Fletcher-Goldfarb-Shanno (BFGS), etc.) at 308. For example, the search direction is determined by solving coupled equations (i.e., stiffness matrix of the FEA model with a specific loading condition) at the particular iteration. After the search direction has been determined, a contact penetration parameter (CPP) associated the search direction is calculated at 310. The CPP is so configured such that it is used for preventing a solution of the implicit FEA analysis to have large contact penetration, when applied to the implicit FEA.

CPP is calculated as a ratio between a set of approximate nodal contact distances and respective no-contact nodal displacements that are predetermined at the onset of each iteration with an assumption of no contact would occur. The set of approximate nodal contact distances is calculated between each of the nodes of the FEA models and each surface formed by the elements of the FEA models. Three different assumptions are used for calculating the approximate nodal contact distances. First, the nodes and the surfaces both are moving. Second, the nodes are moving but the surfaces are stationary. Third, the nodes stationary and the surfaces are moving. The most conservative estimate based on these assumptions is used (e.g., minimum of the three calculations). The no-contact nodal displacements are determined by solving the FEA model with an assumption there is no contact would occur in the particular iteration.

At 312, the process 300 finds a minimum energy imbalance location along the search direction as the solution of non-linear structure response of this iteration. The location is further restricted by the CPP so that contact penetration of the structure is substantially limited thereby overcoming shortcomings of the prior art approaches. Next, at decision 314, it is determined whether the force equilibrium is reached (e.g., below a tolerance). If 'no', another iteration is required for the particular time step, the process goes back to 308. If 'yes', the process 300 moves to 316 incrementing the time to a next time step. Finally, at decision 318, it is determined whether the numerical simulation has ended (e.g., reaches total simulation time set by a user). If 'no', the process 300 goes back to 308 continuing the numerical simulation at the next time step. Otherwise the process 300 ends.

Figure 1:
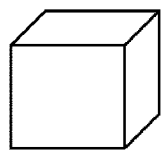
FIG. 1 is a diagram showing various exemplary finite element types.
Figure 1:
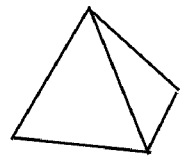
Figure 1:
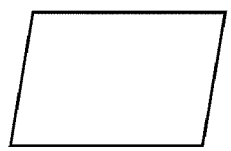
Figure 1:
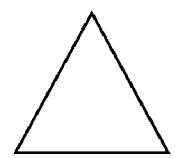
Figure 1:
Figure 2A:
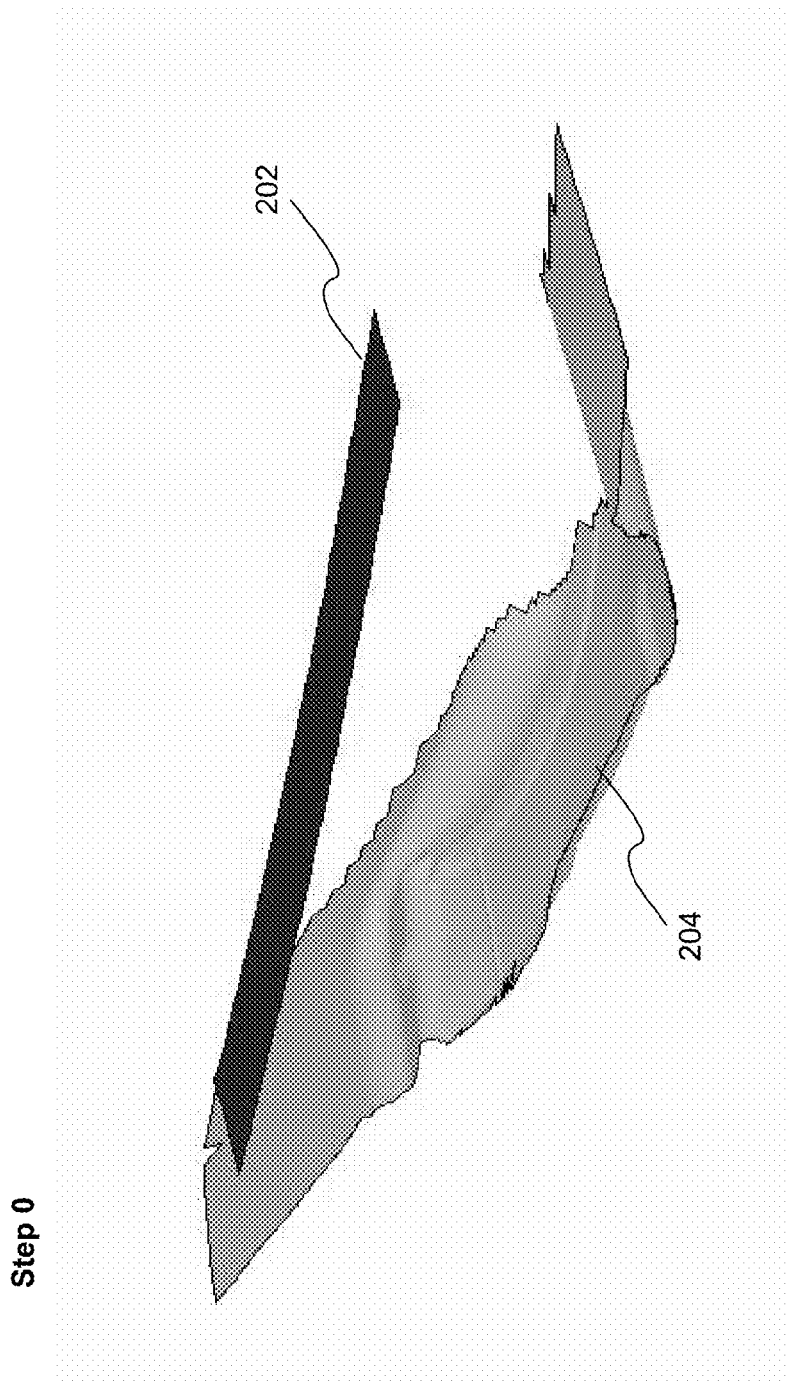
FIGS. 2A and 2B are diagrams showing implicit FEA results of a metal forming simulation at two consecutive time steps in a prior art approach.
Figure 2B:
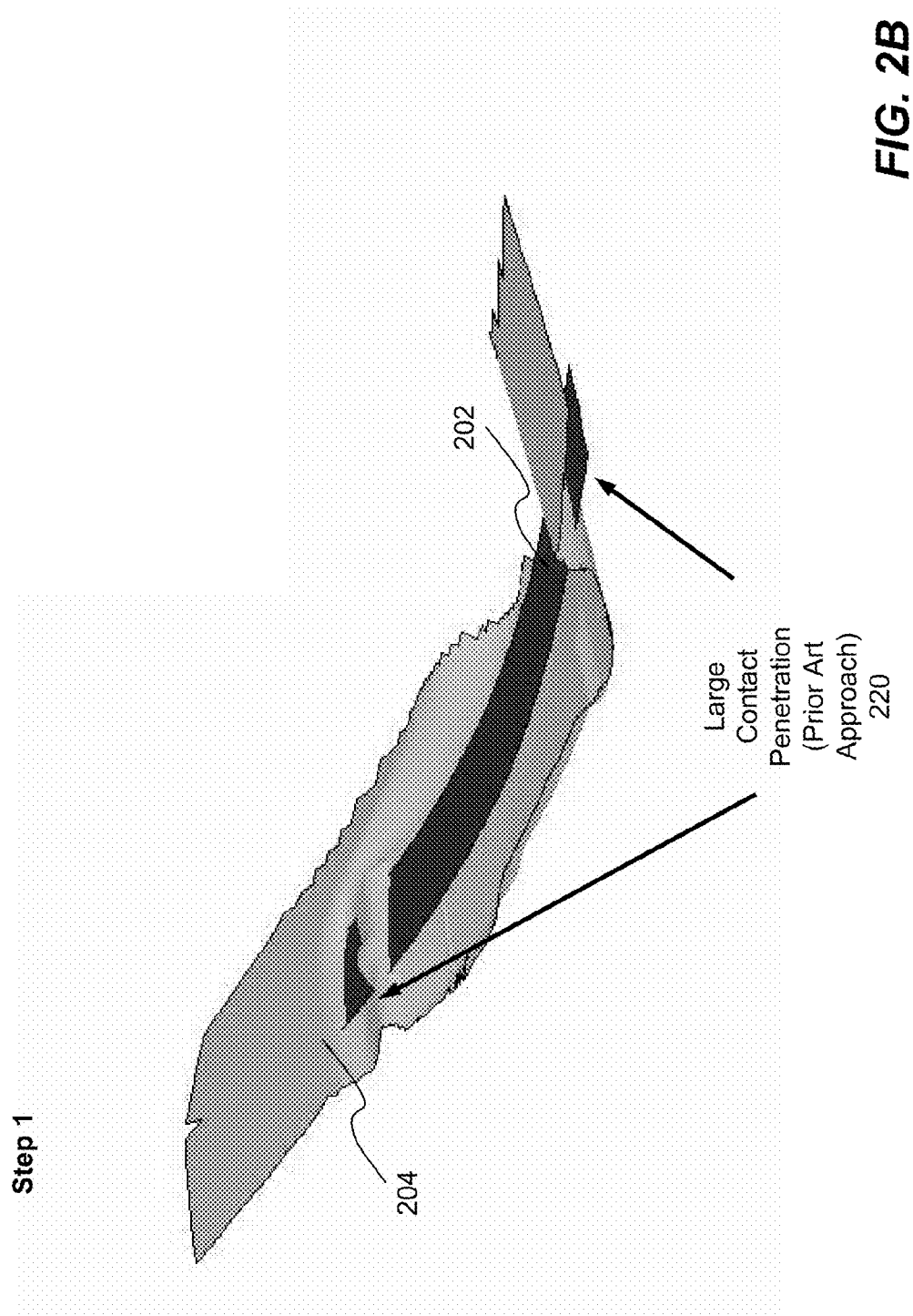
Figure 4A:
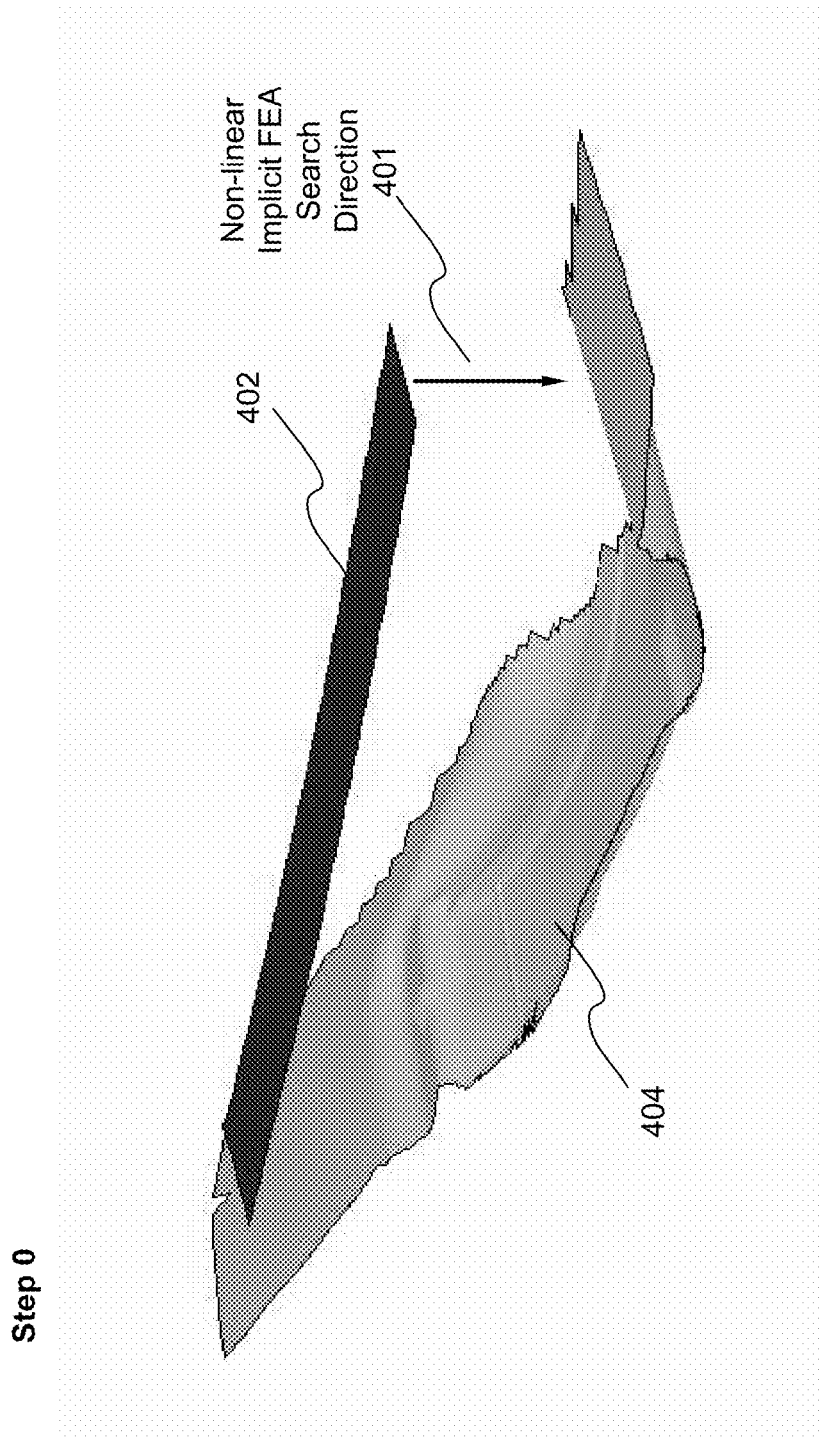
FIG. 4A-4C are diagrams showing exemplary sequence of non-linear structure responses in a metal forming simulation using implicit FEA with contact penetration parameter according to one embodiment of the present invention.
Figure 4B:
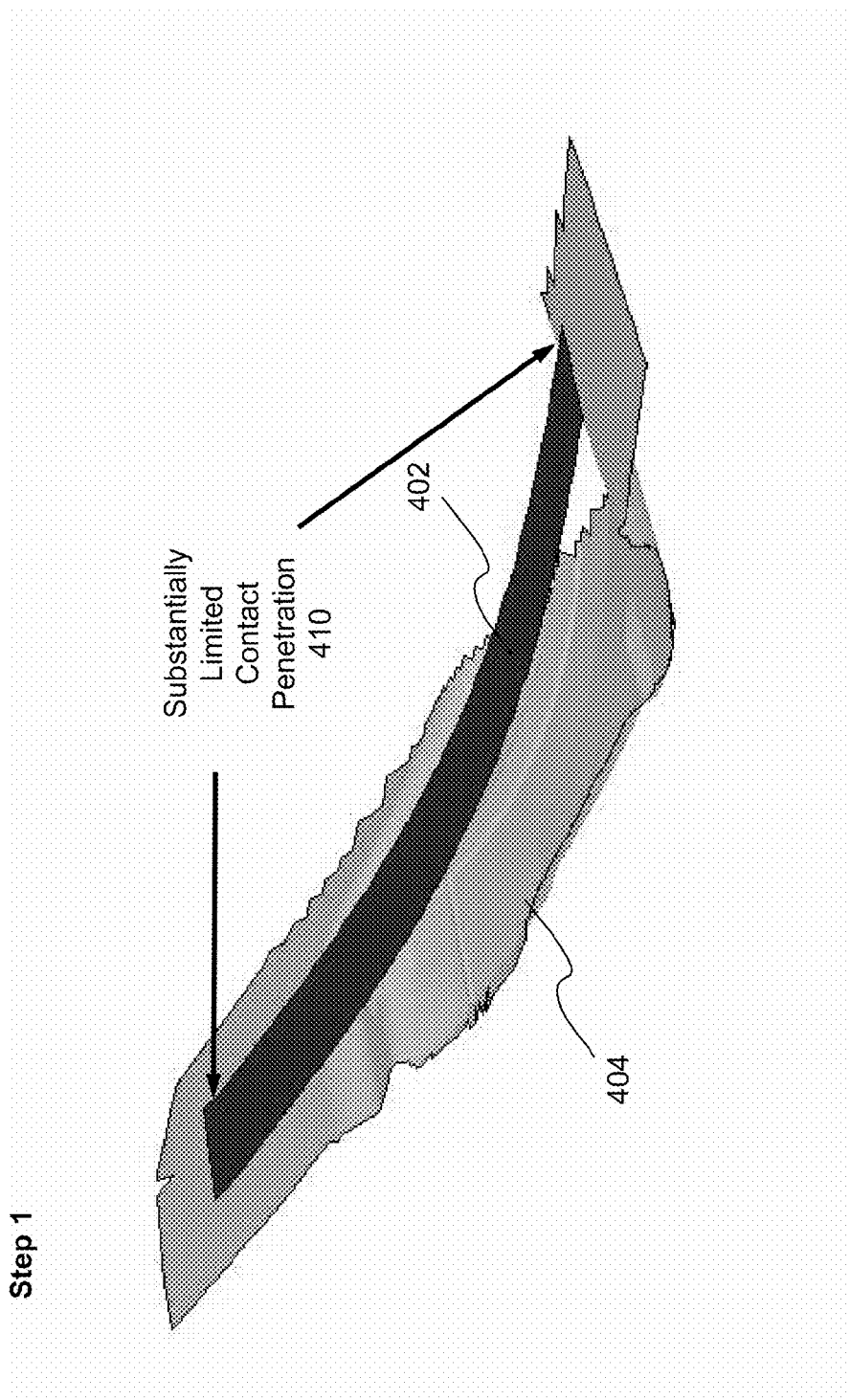
Figure 4C:
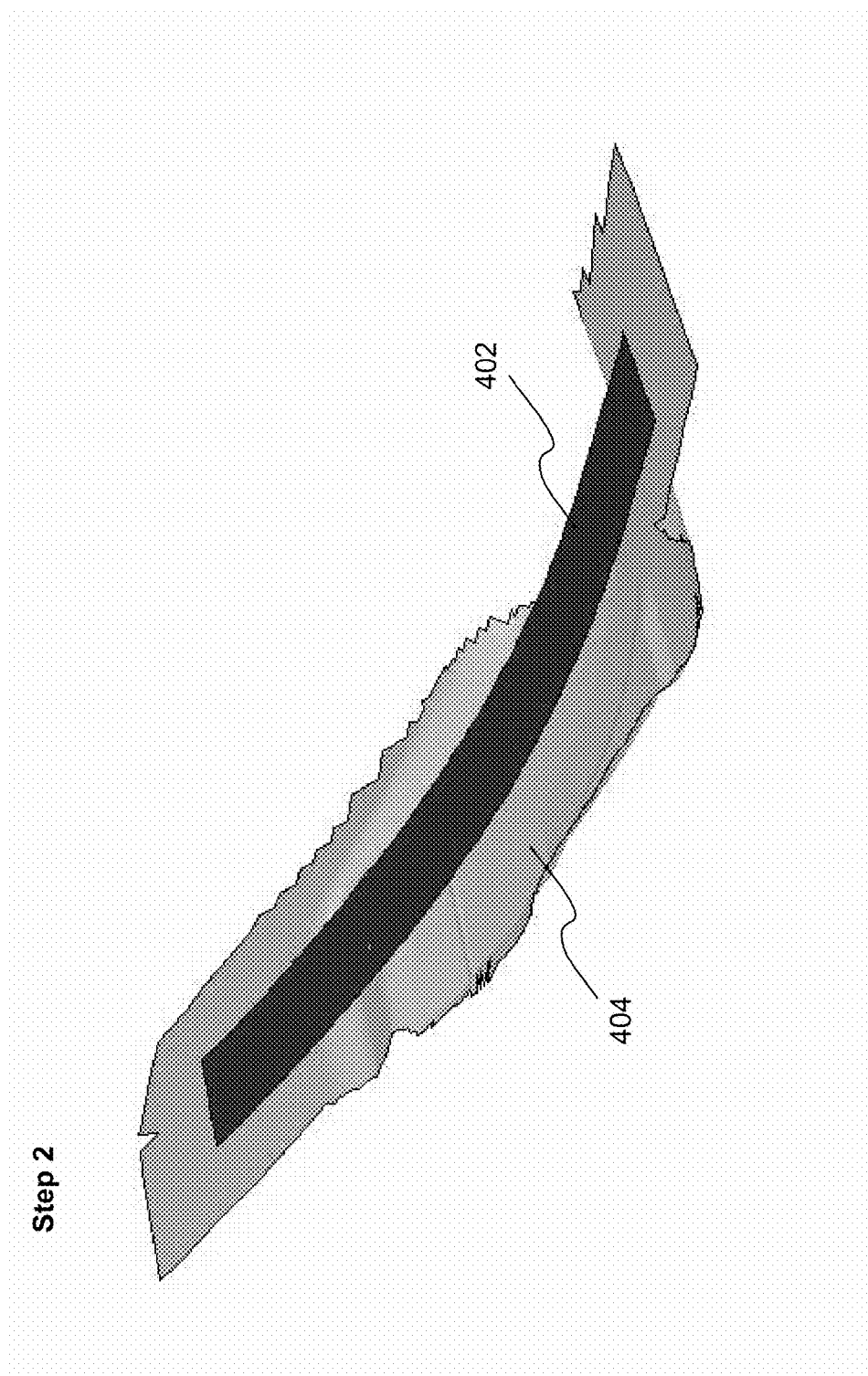

FIGS. 4A-4C shows a sequence of structure responses in an exemplary metal forming simulation using implicit FEA with contact penetration parameter in accordance with one embodiment of the present invention. The structure in FIG. 4A is the same structure shown in FIG. 2A. A first object or part 402 is pushed towards a second object 404 to form a shaped part. A search direction 401 according to a non-linear implicit FEA scheme is shown from the first object 402 towards the second object 404 at step 0 in FIG. 4A. At the next step (step 1) shown in FIG. 4B, the first object 402 is pushed to just barely touching the second object 404. According to one embodiment of the present invention, the structure response shown in FIG. 4B is a result of the implicit FEA with a contact penetration parameter. The contact penetration is substantially limited as shown two contact points 410 in FIG. 4B. Finally, the first part is formed into a different shape in step 2 shown in FIG. 4C. It is noted that whereas the sequence shown in FIGS. 2A-2B shows significant contact penetration, there is no contact penetration in this sequence shown in FIGS. 4A-4C.

Figure 5:
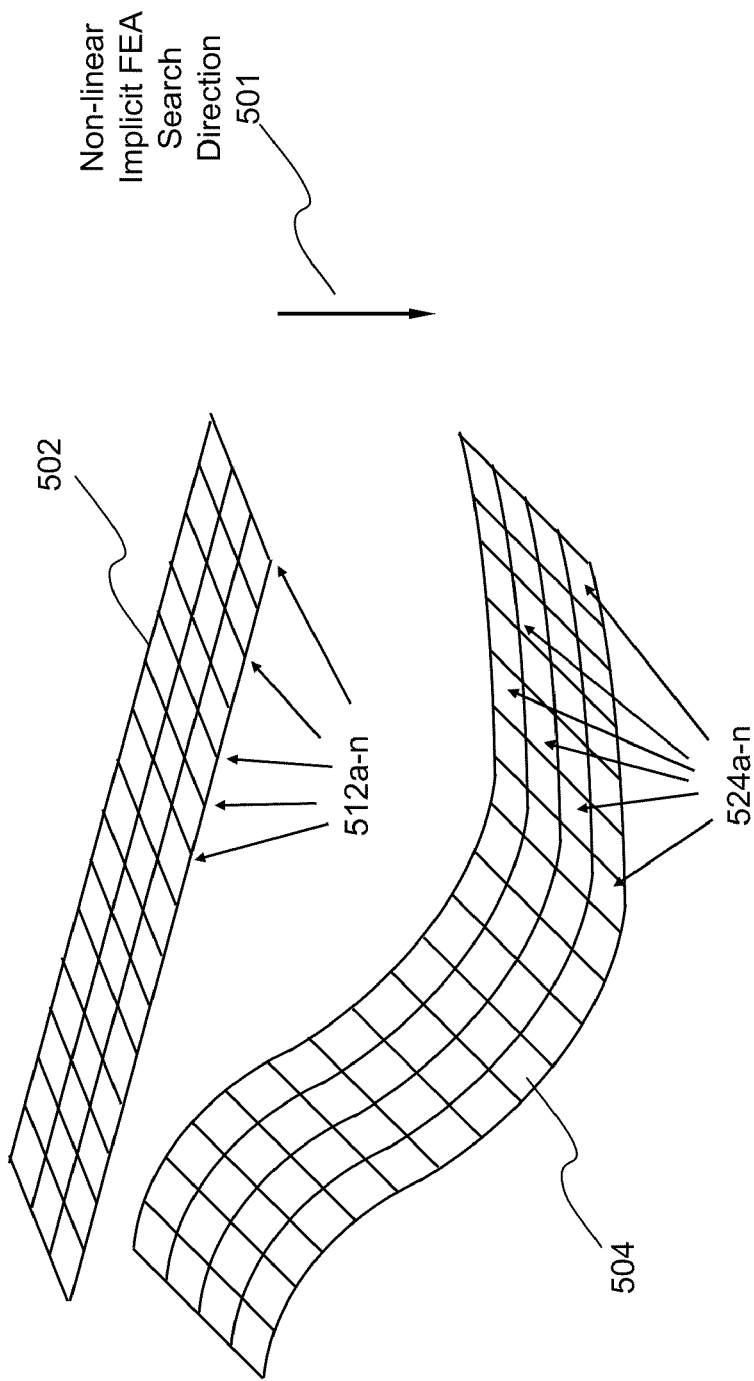
FIG. 5 is a diagram showing exemplary finite element models of the metal forming simulation of FIGS. 4A-4C in accordance with one embodiment of the present invention.

FIG. 5 shows exemplary FEA model of the metal forming simulation of FIGS. 4A-4C in accordance with one embodiment of the present invention. The FEA model includes a first part model 502 and a second object model 504. The first part model 502 includes a plurality of nodes $512a\text{-}n$. A plurality of surfaces $524a\text{-}n$ is formed by elements of the second model 504. The search direction is indicated by a downward arrow 501. To determine contact penetration parameter in the beginning of each iteration of the implicit FEA analysis, a set of approximate nodal contact distances between each of the nodes $512a\text{-}n$ and each of the surfaces $524a\text{-}n$ is calculated first. The calculations are performed using three assumptions (i.e., node, surface moving and stationary) described in FIG. 3. It is evident that the calculations involve every nodes with every elements, which may be time consuming and require a lot of computing resources (i.e., processor cycles). Various known techniques are applied to make this calculation efficient and effective. For example, bucket sort is used such that only elements in relevant buckets need to be considered for a given node.

Figure 6:
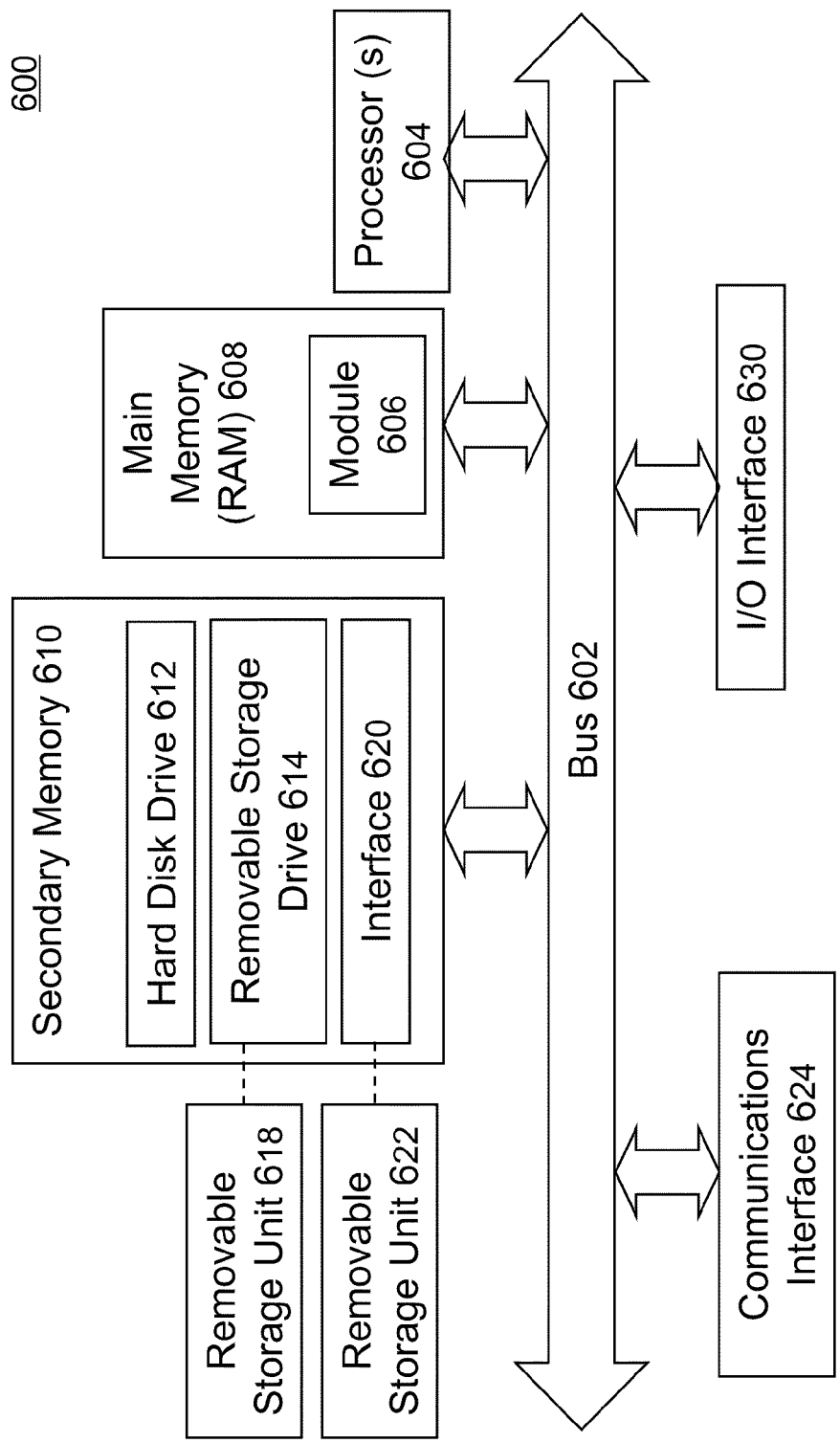
FIG. 6 is a function diagram showing salient components of a computing device, in which an embodiment of the present invention may be implemented.

According to one aspect, the present invention is directed towards one or more computer systems capable of carrying out the functionality described herein. An example of a computer system 600 is shown in FIG. 6. The computer system 600 includes one or more processors, such as processor 604. The processor 604 is connected to a computer system internal communication bus 602. Various software embodiments are described in terms of this exemplary computer system. After reading this description, it will become apparent to a person skilled in the relevant art(s) how to implement the invention using other computer systems and/or computer architectures.

Computer system 600 also includes a main memory 608, preferably random access memory (RAM), and may also include a secondary memory 610. The secondary memory 610 may include, for example, one or more hard disk drives 612 and/or one or more removable storage drives 614, representing a floppy disk drive, a magnetic tape drive, an optical disk drive, etc. The removable storage drive 614 reads from and/or writes to a removable storage unit 618 in a well-known manner. Removable storage unit 618, represents a floppy disk, magnetic tape, optical disk, etc. which is read by and written to by removable storage drive 614. As will be appreciated, the removable storage unit 618 includes a computer usable storage medium having stored therein computer software and/or data.

In alternative embodiments, secondary memory 610 may include other similar means for allowing computer programs or other instructions to be loaded into computer system 600. Such means may include, for example, a removable storage unit 622 and an interface 620. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 622 and interfaces 620 which allow software and data to be transferred from the removable storage unit 622 to computer system 600. In general, Computer system 600 is controlled and coordinated by operating system (OS) software, which performs tasks such as process scheduling, memory management, networking and I/O services. Exemplary OS includes Linux®, Microsoft Windows®.

There may also be a communications interface 624 connecting to the bus 602. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc. Software and data transferred via communications interface 624 are in the form of data packets which may be electronic, electromagnetic, optical, or other equivalent means capable of being received by communications interface 624. These data packets are provided to communications interface 624 via a communications path (i.e., channel). This channel carries data packets and may be implemented using wire or cable, fiber optics, a phone line, a cellular phone link, an RF link, a Bluetooth® wireless link and other communications channels.

The channel facilitates a data packet transmission between a data network and the computer 600 and typically executes a special set of rules (i.e., a protocol) to send data back and forth. One of the common protocols is TCP/IP (Transmission Control Protocol/Internet Protocol) commonly used in the Internet. In general, the communication interface 624 manages the assembling of a data file into smaller packets that are transmitted over the data network or reassembles received packets into the original data file. In addition, the communication interface 624 handles the address part of each packet so that it gets to the right destination or intercepts packets destined for the computer 600. In this document, the terms "computer program medium" and "computer usable medium" are used to generally refer to media such as removable storage drive 614, and/or a hard disk installed in hard disk drive 612. These computer program products are means for providing software to computer system 600. The invention is directed to such computer program products.

The computer system 600 may also include an input/output (I/O) interface 630, which provides the computer system 600 to access monitor, keyboard, mouse, printer, scanner, plotter, and alike.

Computer programs (also called computer control logic) are stored as application modules 606 in main memory 608 and/or secondary memory 610. Computer programs may also be received via communications interface 624. Such computer programs, when executed, enable the computer system 600 to perform the features of the present invention as discussed herein. In particular, the computer programs, when executed, enable the processor 604 to perform features of the present invention. Accordingly, such computer programs represent controllers of the computer system 600.

In an embodiment where the invention is implemented using software, the software may be stored in a computer program product and loaded into computer system 600 using removable storage drive 614, hard drive 612, or communications interface 624. The application module 606, when executed by the processor 604, causes the processor 604 to perform the functions of the invention as described herein.

The main memory 608 may be loaded with one or more application modules 606 that can be executed by one or more processors 604 with or without a user input through the I/O interface 630 to achieve desired tasks. In operation, when at least one processor 604 executes one of the application modules 606, the results are computed and stored in the secondary memory 610 (i.e., hard disk drive 612). The status of the CAE analysis (e.g., numerical simulation using finite element analysis) is reported to the user via the I/O interface 630 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas a metal forming example is shown and described as an application of the present invention, other types of structural contact problem may be simulated. Whereas the metal forming example is shown and described using two-part FEA model, a FEA model with different number of parts (including one part FEA model) may be used. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of limiting contact penetration in numerical simulation of non-linear response of a structure, the method comprises:

defining, by an application module installed in a computer system, a finite element analysis (FEA) model of the structure based on initial geometry of the structure, wherein the FEA model includes a plurality of nodes and a plurality of elements;

performing, by said application module, a time-marching implicit FEA of the FEA model, the time-marching implicit FEA results comprise a plurality of solutions of the non-linear response of the structure at respective time steps, wherein said time-marching implicit FEA results represent numerically simulated structural behavior of the structure and each of the solutions requires at least one iteration to compute and wherein the non-linear response of the structure includes an updated geometry of the structure;

determining, by said application module, a search direction at each of the at least one iteration;

calculating, by said application module, a contact penetration parameter (CPP) in the search direction using the non-linear response of the structure obtained in immediate prior iteration;

creating, by said application module, a CPP modified search direction by limiting the search direction with the CPP such that any potential contact penetration of the structure would be minimized; and determining, by said application module, a minimum energy imbalance location along the CPP modified search direction, wherein said minimum energy imbalance location is a solution of said each of the at least one iteration.

2. The method of claim 1, wherein the contact penetration parameter is calculated as a ratio between a plurality of estimated nodal contact distances and corresponding no-contact nodal displacements that are predetermined at onset of said each of the iterations with an assumption that no contact would occur.

3. The method of claim 2, wherein the plurality of estimated nodal contact distances is calculated as an estimated distance between each of the plurality of nodes and each of a plurality of surfaces formed by the plurality of elements.

4. The method of claim 2, wherein said each of the plurality of nodes and said each of the surfaces are both assumed to be moving along the CPP modified search direction according to the non-linear response and updated geometry of the structure.

5. The method of claim 2, wherein said each of the plurality of nodes is assumed to be moving along the CPP modified search direction according to the non-linear response and updated geometry of the structure while said each of the surfaces is assumed to be stationary.

6. The method of claim 2, wherein said each of the plurality of nodes is assumed to be stationary while said each of the surfaces is assumed to be moving along the CPP modified search direction according to the non-linear response and updated geometry of the structure.

7. The method of claim 6, wherein the CPP is a real number having a value between 0 and 1.

8. The method of claim 1, wherein said determining the minimum energy imbalance location in the CPP modified search direction at said each of the at least one iteration further comprises finding energy imbalance less than a pre-defined tolerance by said application module.

9. A system for limiting contact penetration in numerical simulation non-linear response of a structure, the system comprises:
   an input/output (I/O) interface;
   a computer storage for storing computer readable code for an application module;
   at least one processor coupled to the computer storage, the at least one processor executing the computer readable code in the computer storage to cause the application module to perform operations of:
   defining a finite element analysis (FEA) model of the structure based on initial geometry of the structure, wherein the FEA model includes a plurality of nodes and a plurality of elements;
   performing a time-marching implicit FEA of the FEA model, the time-marching implicit FEA results comprise a plurality of solutions of the non-linear response of the structure at respective time steps, wherein said time-marching implicit FEA results represent numerically simulated structural behavior of the structure and each of the solutions requires at least one iteration to compute and wherein the non-linear response of the structure includes an updated geometry of the structure;
   determining a search direction at each of the at least one iteration;
   calculating a contact penetration parameter (CPP) in the search direction using the non-linear response of the structure obtained in immediate prior iteration;
   creating a CPP modified search direction by limiting the search direction with the CPP such that any potential contact penetration of the structure would be minimized; and
   determining a minimum energy imbalance location along the CPP modified search direction, wherein said minimum energy imbalance location is a solution of said each of the at least one iteration.

10. The system of claim 9, wherein the contact penetration parameter is calculated as a ratio between a plurality of estimated nodal contact distances and corresponding no-contact nodal displacements that are predetermined at onset of said each of the iterations with an assumption that no contact would occur.

11. The system of claim 10, wherein the plurality of estimated nodal contact distances is calculated as an estimated distance between each of the plurality of nodes and each of a plurality of surfaces formed by the plurality of elements.

12. The system of claim 11, wherein said each of the plurality of nodes and said each of the surfaces are both assumed to be moving along the CPP modified search direction according to the non-linear response and updated geometry of the structure.

13. The system of claim 11, wherein said each of the plurality of nodesis assumed to be moving along the CPP modified search direction according to the non-linear response and updated geometry of the structure while said each of the surfaces is assumed to be stationary.

14. The system of claim 11, wherein said each of the plurality of nodes is assumed to be stationary while said each of the surfaces is assumed to be moving along the CPP modified search direction according to the non-linear response and updated geometry of the structure.

15. A non-transitory computer usable medium having computer executable instructions for controlling a computer to perform limiting contact penetration in numerical simulation of non-linear response of a structure by a method comprising:
   defining a finite element analysis (FEA) model of the structure based on initial geometry of the structure, wherein the FEA model includes a plurality of nodes and a plurality of elements;
   performing a time-marching implicit FEA of the FEA model, the time-marching implicit FEA results comprise a plurality of solutions of the non-linear response of the structure at respective time steps, wherein said time-marching implicit FEA results represent numerically simulated structural behavior of the structure and each of the solutions requires at least one iteration to compute and wherein the non-linear response of the structure includes an updated geometry of the structure;
   determining a search direction at each of the at least one iteration;
   caulating a contact penetration parameter (CPP) in the search direction using the non-linear response of the structure obtained in immediate prior iteration;
   creating a CPP modified search direction by limiting the search direction with the CPP such that any potential contact penetration of the structure would be minimized; and
   determining a minimum energy imbalance location along the CPP modified search direction, wherein said minimum energy imbalance location is a solution of said each of the at least one iteration.

16. The non-transitory computer usable medium of claim 15, wherein the contact penetration parameter is calculated as a ratio between a plurality of estimated nodal contact distances and corresponding no-contact nodal displacements that are predetermined at onset of said each of the iterations with an assumption that no contact would occur.

17. The non-transitory computer usable medium of claim 16, wherein the plurality of estimated nodal contact distances is calculated as an estimated distance between each of the plurality of nodes and each of a plurality of surfaces formed by the plurality of elements.

18. The non-transitory computer usable medium of claim 17, wherein said each of the plurality of nodes and said each of the surfaces are both assumed to be moving along the CPP modified search direction according to the non-linear response and updated geometry of the structure.

19. The non-transitory computer usable medium of claim 17, wherein said each of the plurality of nodes is assumed to be moving along the CPP modified search direction according to the non-linear response and updated geometry of the structure while said each of the surfaces is assumed to be stationary.

20. The non-transitory computer usable medium of claim 17, wherein said each of the plurality of nodes is assumed to be stationary while said each of the surfaces is assumed to be moving along the CPP modified search direction according to the non-linear response and updated geometry of the structure.

* * * * *

UNITED STATES PATENT AND TRADEMARK OFFICE
CERTIFICATE OF CORRECTION

| | | |
|---|---|---|
| PATENT NO. | : 7,953,578 B2 | Page 1 of 1 |
| APPLICATION NO. | : 12/127095 | |
| DATED | : May 31, 2011 | |
| INVENTOR(S) | : Roger Grimes et al. | |

It is certified that error appears in the above-identified patent and that said Letters Patent is hereby corrected as shown below:

on the title page

(12) United States Patent          "Roger et al." should read --Grimes et al.--

(75) Inventors:          the name "Grimes Roger" should read --Roger Grimes--

Signed and Sealed this
Twelfth Day of July, 2011

David J. Kappos
*Director of the United States Patent and Trademark Office*